US008541926B2

(12) United States Patent
Pulskamp et al.

(10) Patent No.: US 8,541,926 B2
(45) Date of Patent: Sep. 24, 2013

(54) NANO/MICRO ELECTRO-MECHANICAL RELAY

(75) Inventors: Jeffrey S. Pulskamp, Leesburg, VA (US); Daniel C. Judy, Ridgley, MD (US); Fay D. Sharman, legal representative, Ridgley, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 13/169,374

(22) Filed: Jun. 27, 2011

(65) Prior Publication Data

US 2012/0325630 A1 Dec. 27, 2012

(51) Int. Cl.
*H01L 41/08* (2006.01)

(52) U.S. Cl.
USPC ............................ 310/330; 310/332; 310/344

(58) Field of Classification Search
USPC .................................................. 310/330–332
See application file for complete search history.

(56) References Cited

U.S. PATENT DOCUMENTS

| | | | | | |
|---|---|---|---|---|---|
| 4,595,855 | A | * | 6/1986 | Farrall | 310/332 |
| 4,620,123 | A | * | 10/1986 | Farrall et al. | 310/331 |
| 4,868,448 | A | * | 9/1989 | Kornrumpf | 310/331 |
| 4,893,048 | A | * | 1/1990 | Farrall | 310/331 |
| RE33,618 | E | * | 6/1991 | Harnden, Jr. et al. | 310/331 |
| RE33,691 | E | * | 9/1991 | Harnden, Jr. et al. | 310/331 |

* cited by examiner

*Primary Examiner* — Mark Budd
(74) *Attorney, Agent, or Firm* — Alan I. Kalb

(57) ABSTRACT

A nano/micro electro-mechanical relay, comprising an at least one normally open (NO) nano/micro relay switch and an at least one normally closed (NC) nano/micro relay switch. Both the NC nano/micro relay switch and the NO nano/micro relay switch can be switched between their respective normal relay switch positions and their respective actuated relay switch positions. An at least one nano/micro actuator including an at least one piezoelectric stack layer being attached to an at least one elastic layer, wherein the at least one piezoelectric stack layer contracts to deflect the at least one elastic layer, and thereby actuate the at least one nano/micro contact bar to simultaneously switch the NC nano/micro relay switch and the NO nano/micro relay switch between their respective normal relay switch position and their respective actuated relay switch positions.

20 Claims, 7 Drawing Sheets

NANO/MICRO ELECTRO-MECHANICAL RELAY

GOVERNMENT INTEREST

The invention described herein may be manufactured, used and licensed by or for the U.S. Government.

FIELD OF INVENTION

The present disclosure relates electro-mechanical relays, particularly to electro-mechanical relays that can operate as Micro-Electro-Mechanical Systems (MEMS) technology as well as nanotechnology.

BACKGROUND OF THE INVENTION

Electro-mechanical relays were historically discrete analog switches that were used in early computers for such applications as to implement Boolean logic. Discrete electro-mechanical relays continue in common usage for certain commercial, automotive, communications, automation, power, and other applications. Inherent advantages of electro-mechanical relays include relatively low current leakage and excellent reliability of operation.

Transistors have largely supplanted electro-mechanical relays in such applications as computers, digital logic, and communications. Fabrication of transistors, and other such devices, relies on such solid-state semiconductor processing techniques. Conventional transistors (including, for example, NMOS, CMOS, field effect transistors, bipolar transistors, or other types) have some voltage drop across their terminals that typically result in current leakage. Such leakage can result in considerable power consumption for the transistors themselves as well as their associated circuits. Additionally, transistors have difficulty operating in harsh or radioactive environments.

Therefore, there is a need in the art for switching devices having limited current leakage, as well as being able to function in harsh or radioactive environments.

BRIEF SUMMARY OF THE INVENTION

Embodiments of the present invention include a nano/micro electro-mechanical relay, comprising an at least one normally open (NO) nano/micro relay switch and an at least one normally closed (NC) nano/micro relay switch. Both the NC nano/micro relay switch and the NO nano/micro relay switch operationally include at least one displaceable contact pad that can be displaced relative to at least one substrate anchored pad to substantially simultaneously switch the NC nano/micro relay switch and the NO nano/micro relay switch between their respective normal relay switch positions and their respective actuated relay switch positions. An at least one nano/micro actuator including an at least one piezoelectric stack layer being attached to an at least one elastic layer, wherein to actuate the at least one nano/micro actuator, the at least one piezoelectric stack layer contracts to deflect the at least one elastic layer. Certain embodiments of the nano/micro electro-mechanical relay can further include at least one nano/micro contact bar that when actuated by the at least one nano/micro actuator configured to simultaneously switch the NC nano/micro relay switch and the NO nano/micro relay switch between their respective normal relay switch position and their respective actuated relay switch positions. The simultaneous switching can be at least partially in response to deflection of the at least one nano/micro actuator.

DETAILED DESCRIPTION OF THE INVENTION

Figure 1:
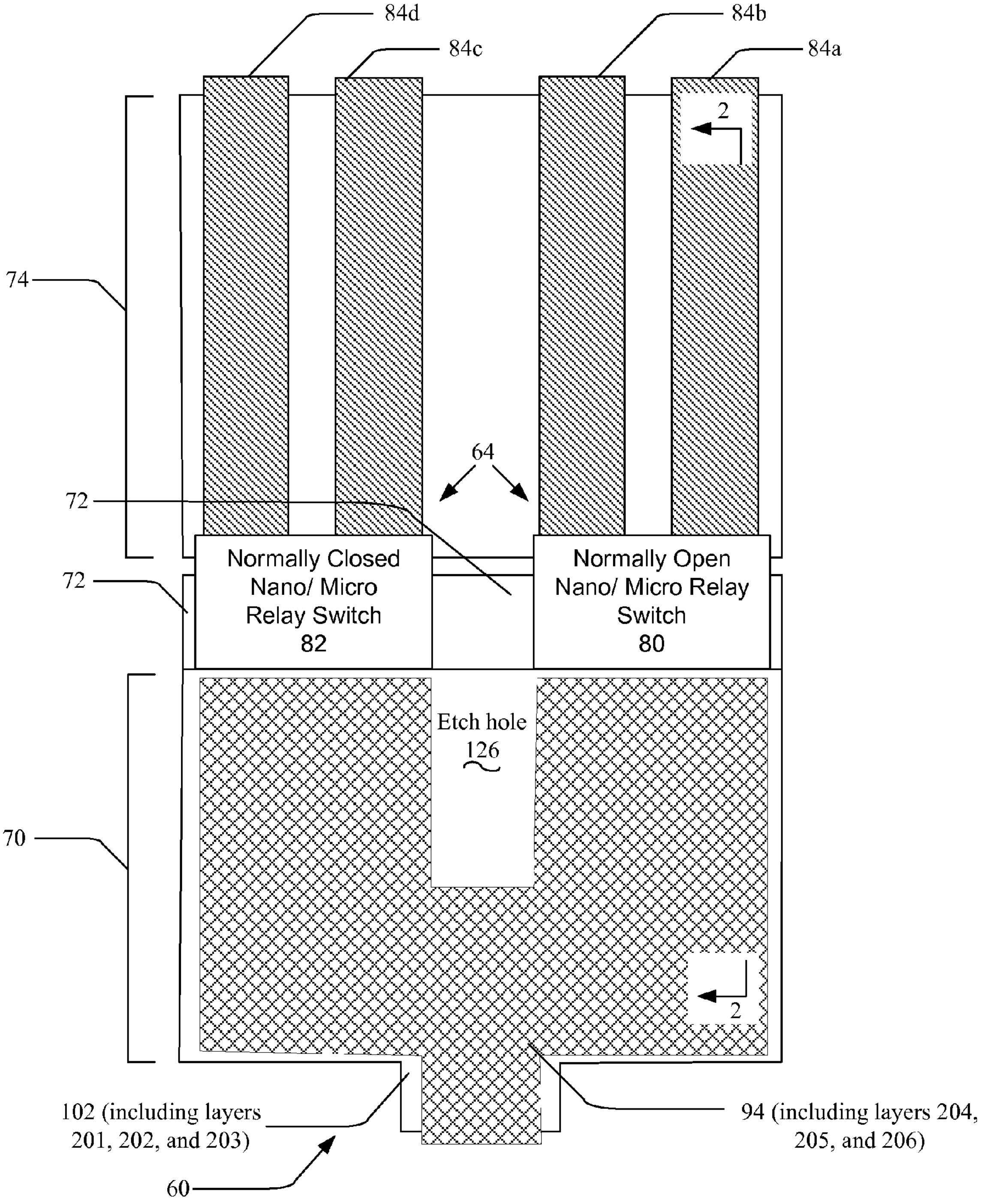
FIG. 1 illustrates a top view of one embodiment of a nano/micro electro-mechanical relay.

Throughout this disclosure, similar reference characters may be provided for similar elements in the different embodiments, which may perform identical or similar functions. For example, there are multiple conductive traces attached to each of the normally open (NO) relay switch and normally closed (NC) relay switch in each of the different embodiments of the relay switches illustrated in different ones of the figures. As such, each conductive trace may be provided the same reference number, though a reference letters can be appended where necessary such as 84, 84*a*, 84*b*, 84*c*, 84*d*, etc. Within this disclosure, any description referring to one device having the reference character can refer, depending on context, to other devices sharing that reference character.

FIG. 1 illustrates a top view of one embodiment of a nano/micro electro-mechanical relay 60. This disclosure provides a number of embodiments of the nano/micro electro-mechanical relays 60 as described in a general with respect to FIG. 1. Certain embodiments can be fabricated utilizing such solid-state techniques as ultra-large scale integration and micro-electro-mechanical system (hereinafter referred to as "MEMS"), and also may be configured to operate within the nanoscale. Such minute devices in many cases, such as the present instance, can be analogized, modeled, or scaled to operate predictably largely based upon a well-developed understanding of discrete electro-mechanical devices such as relays. MEMS devices are becoming better known for such applications as relatively minute and distributed devices, sensors, controllers, and along with nanotechnology allow scaling a variety of traditional mechanical or electro-mechanical designs and methods with electronic, electro-mechanical, digital logic, and/or processor or computer-controlled functionalities to the micro-scale.

A nano/micro electro-mechanical relay 60 provides some of the design functionality that can be used to provide a variety of nano/micro electro-mechanical digital relay circuits, some of which are described later in the disclosure. Certain embodiments of the nano/micro relay switch pairs 64 comprise at least one NO (normally open) nano/micro relay switch 80, at least one NC (normally closed) nano/micro relay switch 82 and a nano/micro actuator 70. As known with switch terminology, each NO nano/micro relay switch 80 and NC nano/micro relay switch 82 can be configured to be switched between the closed (e.g., on) position and the open (e.g., off) position. The normal position for each NO nano/micro relay switch 80 or NC nano/micro relay switch 82, representing the position without actuation while the actuated position represents the respective position during actuation. As such, NO nano/micro relay switches would normally be open, but upon actuation are closed. By comparison, NC nano/micro relay switches are normally be closed, but open upon actuation.

One advantage of bringing the nano/micro electro-mechanical relay 60 to the nanoscale as well as to ULSI (ultra-large scale integration), or even lower levels, is that such structures can be fabricated using techniques presently being applied for transistor-based devices, such as complementary metal oxide semiconductor (CMOS). Many transistor-based switching devices rely on biasing the different terminals of the transistor to alter the electric current passing through the transistor. By comparison, certain embodiments of the nano/micro electro-mechanical relay can provide switching functionality based on an electrically controlled mechanical displacement of at least part of the nano/micro relay switch pair 64 resulting largely by actuating the nano/micro relay switch pair 64.

Certain embodiments of the nano/micro actuator 70 are configured to mechanically displace or reposition the nano/micro contact bar 72, which acts to support portions of the nano/micro relay switch pair 64, between their respective normal and actuated positions. Certain embodiments of the nano/micro actuator 70 of the nano/micro electro-mechanical relay 60 acts to transition the nano/micro relay switch pair 64 into their actuated positions by bending the nano/micro actuator 70, and thereby displacing the nano/micro contact bar 72 and the attached nano/micro relay switch pair 64, out of or into the paper relative to the viewer. Displacements by which the nano/micro contact bar 72 that supports the NO nano/micro relay switch 80 and NC nano/micro relay switch 82, acts to displace such relay switches 80, 82 out of or in to the paper in FIG. 1. A variety of configurations and embodiments of the nano/micro relay switch pair 64 can thereby be operationally transitioned between their normal and actuated positions by displacing certain embodiments of the nano/micro electro-mechanical relay 60, as described in this disclosure.

FIG. 1 shows an etch hole 126 that is formed into the actuator 70. By configuring certain etch hole(s) 126 as desired, a single nano/micro actuator 70 can be subdivided into multiple smaller nano/micro actuators 70. The dimensions, configurations, materials, and the etch holes formed within the actuator 70 is a design choice, and not intended to be limiting in scope. For satisfactory electrical designs, the electrical contacts must remain sufficiently spaced from other electrical contacts or connectors of the nano/micro electro-mechanical relay 60 (such as conductive traces 84 and other electric contact members as described herein, for example). As such, trenches, or other spaces, can be formed between the actuator 70 and any other electric contact member that is likely to limit any electrical current flow, interference, or noise between the actuator 70 and other contacts.

Figure 2:
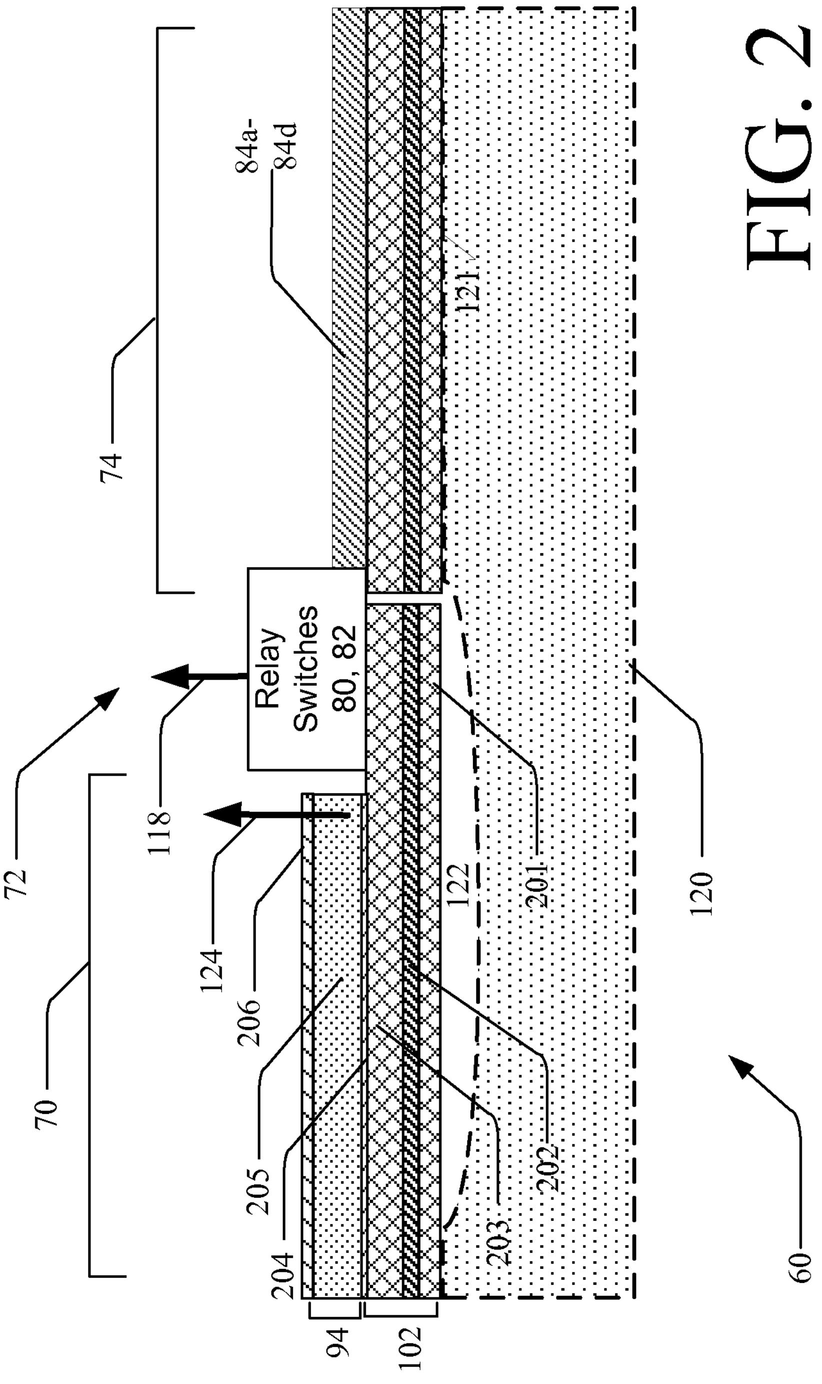
FIG. 2 illustrates a partial cross-sectional view of one embodiment of a nano/micro electro-mechanical relay as taken through sectional lines 2-2 of FIG. 1, also shown is a dotted-line outline of a substrate that supports the nano/micro electro-mechanical relay.

FIG. 2 shows one embodiment of the nano/micro electro-mechanical relay 60, as viewed through sectional lines 2-2 of FIG. 1. Also shown is a dotted-line outline of an at least one substrate 120 that supports the nano/micro electro-mechanical relay. The nano/micro actuator comprises a piezoelectric stack 94 and elastic layers 102. During actuation, the nano/micro actuator 70 deflects such as by bowing up at the right side as a result of a force in the direction indicated by arrow 124. This force 124 is applied over a greater area by the piezoelectric stack layers 94, but results in a deflection to the nano/micro contact bar 72. With such deflection, the NO nano/micro relay switch 80 and the NC nano/micro relay switch 82 (both attached to and supported by nano/micro contact bar 72), are both displaced upward as shown by the arrow 118. Such mechanical upward displacement of certain portions of the NO nano/micro relay switch 80 and the NC nano/micro relay switch 82 transitions these nano/micro relay switches from the normal position to the actuated position.

As soon as the nano/micro actuator 70 ceases applying the actuating force it is no longer being deflected into the actuated position, and it returns to the normal position due largely to the spring constant or stored elastic energy of the actuatable segment 68 and can be augmented through applying a voltage (less than the coercive voltage of the piezoelectric layer 205) in the opposite polarity of the aforementioned actuation voltage. The nano/micro contact bar 72 (supporting the displaceable portions of the NO nano/micro relay switch 80 and NC nano/micro relay switch 82) then returns from the actuated position to their normal position. Since both the NO nano/micro relay switch 80 and the NC nano/micro relay switch 82 are supported by and attached to the nano/micro contact bar 72. As the nano/micro contact bar 72 transitions between the normal and actuated positions, so do the NO nano/micro relay switch 80 and the NC nano/micro relay switch 82. An array of the nano/micro relay switch pairs 64 could be provided. Provided each one of the nano/micro relay switch pair 64 in the array were being simultaneously actuated or deactuated, the various relay switches could act simultaneously. Such simultaneous actuation and de-actuation would be important for such data-centric applications as memories, data transfers, shift registers, microcomputers, etc.

The at least one substrate 120 supports the nano/micro actuator 70, the nano/micro contact bar 72, and the anchored contact segment 74. The layers of the anchored contact segment 74 are attached to the substrate 120, and can be considered a unitary portion. During operation, the anchored contact segment 74 exhibits little or no flex due to the connection to the substrate 120. The anchored contact segment 74 each has a number of NO conductive traces 84*a* and 84*b* (both in electric communication with the NO nano/micro relay switch 80); as well as a number of NC conductive traces 84*c* and 84*d* (both in electric communication with the NC nano/micro relay switch 82 mounted thereupon).

Certain embodiments of the nano/micro actuator 70 includes the layers of the piezoelectric stack layers 94 combined with the layers of the elastic layers 102. All adjacent layers referenced relative to the figures as 201, 202, 203, 204, 205, and 206 are illustrated as being attached or bonded to adjacent layers, so the layers may be viewed as moving as a unitary non-homogenous member forming the nano/micro actuator or the nano/micro contact bar.

Certain embodiments of the nano/micro actuator 70 rely, during actuation, upon the interaction between the elastic layers 102 and the piezoelectric stack layer 94. In general, the elastic layers 102 are easily laterally bendable (bend up and down as viewed in FIG. 2 in the direction shown by arrow 118), but have considerable resistance to compression or expansion in a direction perpendicular to the left or right as viewing FIG. 2.

Certain embodiments of the set of elastic layers 102 include a first elastic layer 201, a second elastic layer 202, and a third elastic layer 203. The structure of the first elastic layer 201, the second elastic layer 202, and the third elastic layer 203 also extends into the nano/micro contact bar 72. The first elastic layer 201 can include, for example, silicon dioxide or other suitable material that might be but does not have to be a dielectric material. The second elastic layer 202 can include, for example, silicon nitride or other suitable material that might be but does not have to be a dielectric material. The third elastic layer 203 can include, for example, silicon dioxide or other suitable dielectric to act as an electric insulator and limit electric current flowing from the actuator electrode layer 204 through the elastic layers 102, conductive traces 84, the substrate 120, and/or electric ground attached to the substrate. Though three layers 201, 202, and 203 are illustrated in the elastic layers 102, a greater of lesser number of layers could be used, and the number of layers or configuration of these layers represents a design choice. It is important that at least one of these layers includes a dielectric material for the above electrical insulating reason. The particular materials or thicknesses as described relative to FIG. 1, and other places through this disclosure, are a design choice and is not intended to be limiting in scope. Instead of utilizing silicon-based technologies, certain embodiments of the elastic layers 102 or other portion of the nano/micro electro-mechanical relay 60 can utilize gallium arsenide or other well-known semiconductor technologies. A variety of device and substrate configurations, designs, and materials can be integrated to allow flexibility.

The piezoelectric stack layers 94 contracts when a suitable electric voltage is applied between the actuator electrode layers 204 and 206 to actuate the piezoelectric stack layers 94 of the nano/micro actuator 70. Each of the layers forming both the elastic layers 102 and the piezoelectric stack layers 94 (i.e., 201, 202, 203, 204, 205, and 206) may be viewed as bonded to their adjacent layers or layer. As such, as the piezoelectric actuator layer 205 starts contracting during actuation (caused by a suitable bias voltage being applied across actuator electrode layers 204 and 206), the elastic layers 102 tend to deflect laterally in the general direction shown by arrow 124 in the direction towards the contracting piezoelectric stack layers 94. In addition to the nano/micro actuator 70 being deflected, the nano/micro contact bar 72 is also forced upwards, that in turn displaces deflectable portions of both the NO nano/micro relay switch 80 and NC nano/micro relay switch 82 upwardly into their actuated positions.

Figure 3:
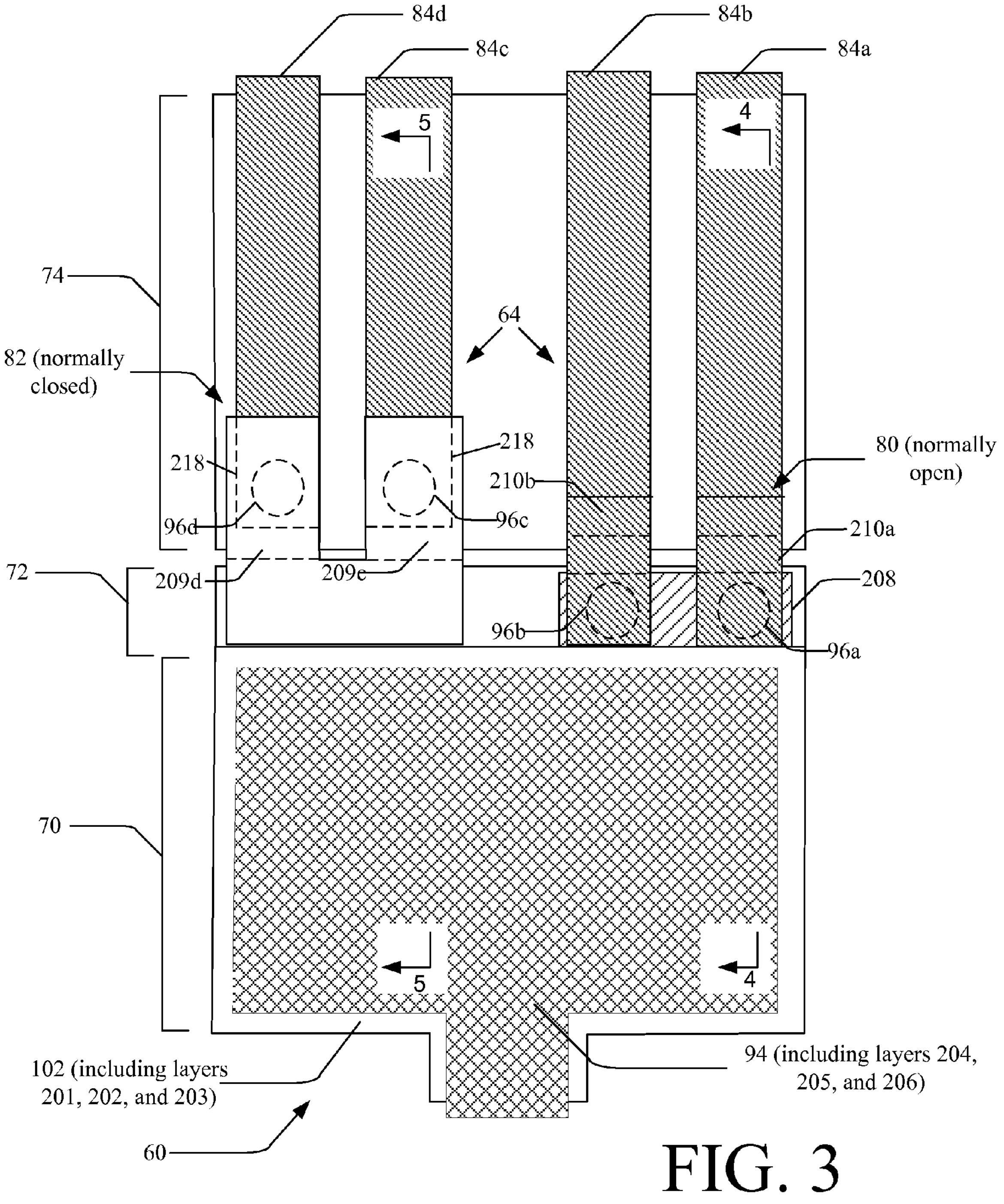
FIG. 3 is a top view of another embodiment of a nano/micro electro-mechanical relay.

FIG. 3 is a top view of one embodiment of a nano/micro electro-mechanical relay 60. Certain embodiments of the NO conductive traces 84*a* and 84*b*, and NC conductive traces 84*c* and 84*d*, are illustrated as extending across and being attached to the nano/micro contact bar 72. Operationally, the conductive traces 84*a*-84*d* are not configured in the nanoscale or MEMS level, and might well, for instance, provide a location for electric contacts or interconnects to be made to other circuits. The nano/micro actuator 70 (comprising elastic layers 102 and the piezoelectric stack layers 94) and the nano/micro contact bar 72 can together provide deflecting structural support for portions of certain embodiments of NO nano/micro relay switches 80 and NC nano/micro relay switches 82. Such structures can provide sufficient flexibility such as to allow deflection of the associated nano/micro relay components (e.g., supported by the nano/micro contact bar 72) during actuation.

Such deflection can result in, for example, the NO nano/micro relay element being deflected to its closed position or alternately in a NC nano/micro relay element position being deflected to its open position. Such deflection can occur under the influence of distortion of the nano/micro actuator 70, and can require some degree of flexibility within each of the deflectable elements of the actuatable segment 68, such as between the nano/micro actuator 70 and the associated nano/micro contact bar 72. Making the elastic layers 102 of the nano/micro actuator 70 and/or the nano/micro contact bar 72 suitably flexible can at least partially enable such deflections by the nano/micro actuator 70.

Certain embodiments of the nano/micro electro-mechanical relay 60 are secured on and mounted to the substrate 120. The substrate 120 includes support substrate faces 121 formed thereupon, with a release etch trench 122 formed within a portion of the support substrate face. A considerable portion of the nano/micro actuator 70 and the nano/micro contact bar 72 is formed above the release etch trench 122 and as such is not affixed to the substrate 120, and can thereby be deflected by pressure applied by the nano/micro actuator 70 including the piezoelectric stack layers 94 as shown at 124.

The entire length of the anchored contact segments 74 is attached to the substrate 120, and as such the anchored contact segments remains stationary relative to the substrate. The anchored contact segments 74 is therefore not susceptible to deflections from applied forces from the nano/micro actuator 70 in a direction represented generally by arrow 124. Within this disclosure, any pad or cantilever that is affixed to the anchored contact segment 74 is referred to respectively as a substrate anchored pad or substrate anchored cantilever. During actuation, the nano/micro actuator 70 exhibits a bowing deflection depending upon the configuration of the piezoelectric stack layers 94, that results in deflection of the nano/micro contact bar 72 as well as the supported portions of the NO nano/micro relay switch 80 and NC nano/micro relay switch 82 that are displaced during actuation, as shown by arrow 118. Within this disclosure, pads or cantilevers that are affixed to the NO nano/micro relay switch 80 or the NC nano/micro relay switch 82, and therefore move along with the switches can be referred to as displaceable contact pads (also contact pads) or displaceable contact cantilevers (also contact cantilevers).

Certain stationary portions of the NO nano/micro relay switch 80 and NC nano/micro relay switch 82 (such as substrate anchored cantilevers and substrate anchored pads, as described below) are supported by and remain stationary relative to the anchored contact segments 74. This relative deflection with respect to a fixed surface causes both the NC nano/micro relay switches 82 and the NO nano/micro relay switches 80 to change states. By comparison, support substrate face 121 of the substrate 120 supports, and is attached to, virtually the entire anchored contact segment 74, and thereby the anchored contact segment 74 remains relatively rigid during actuation. The anchored contact segment 74 is maintained substantially fixed along most of its surface area to the substrate 120, and therefore any motion by the other nano/micro relay switches 80, 82 can be countered by the anchored contact segment 74 as if it is a part of the substrate 120.

During operation, the NO nano/micro relay switch 80 remains in its normal open state until actuated, at which time it is displaced into its closed state. Conversely, the NC nano/micro relay switch 82 remains in its closed state until actuated, at which time it is displaced into its open state. As a result of concurrent movement of all members being actuated from the nano/micro contact bar 72, actuation can simultaneously actuate or deactivate both the NO nano/micro relay switches 80 and the NC nano/micro relay switches 82. There can be a variety of arrangements, materials, and configurations of NO nano/micro relay switches 80 and/or NC nano/micro relay switches 82 (or even extensive or varied arrays in certain embodiments).

Certain embodiments of the nano/micro actuator 70, when actuated or de-actuated such as by an application of electrical current, can be configured to cause a corresponding deflection of at least a portion of the nano/micro contact bar 72 as shown by arrow 118. The nano/micro actuator 70 can be configured to include the piezoelectric actuator layer 205 or other similar material, such as to provide a contraction based on application of electric voltage. Internal flexibility of the elastic layers 102 provides for deflection of the nano/micro actuator 70 and the nano/micro contact bar 72. Particularly, during actuation, the nano/micro actuator 70 contracts causing the nano/micro actuator 70 to flex upwardly and generally forcing the nano/micro contact bar 72 such as including supporting the NO nano/micro relay switch 80 and the NC nano/micro relay switch 82 to be displaced upwardly in the direction of the arrow 124 during actuation. To deactuate certain embodiments of the NO nano/micro relay switch 80 and NC nano/micro relay switch 82, the opposed process to that described in this paragraph is followed such that the nano/micro contact bar 72 is returned to its normal position from its actuated position. The overall configurations, dimensions, and materials of the piezoelectric stack layer 94 relative to the elastic layers 102 are selected to determine the amount of displacement of the nano/micro relay switches 80 and 82.

Figure 4:
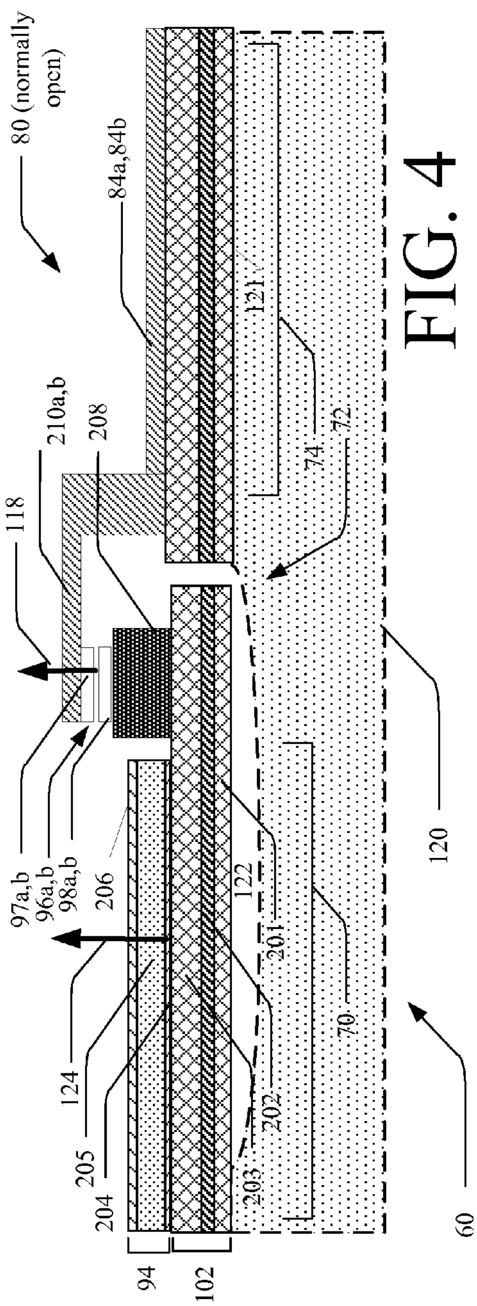
FIG. 4 illustrates a partial cross-sectional view of one embodiment of a nano/micro electro-mechanical relay as taken through sectional lines 4-4 of FIG. 3, also with a dotted outline of a supporting substrate structure.
Figure 5:
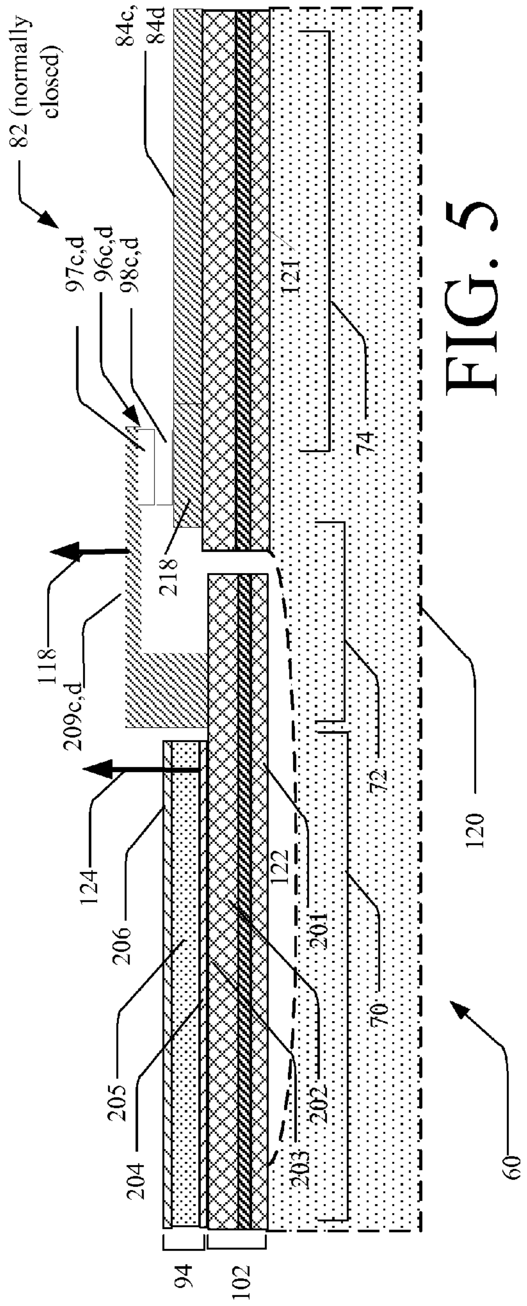
FIG. 5 illustrates a partial cross-sectional view of one embodiment of a nano/micro electro-mechanical relay as taken through sectional lines 5-5 of FIG. 3, also with a dotted outline of a supporting substrate structure.

Within this disclosure, FIGS. 3 to 5 illustrate a number of embodiments of the NO nano/micro relay switch 80 and the NC nano/micro relay switch 82. Certain embodiments of the NO nano/micro relay switch 80 can include some combination of substrate-anchored cantilevers 210*a* and 210*b* and substrate anchored pads 218 that remain stationary relative to the anchored contact segments 74 and the substrate 120. Certain embodiments of the NC nano/micro relay switch 82 can include displaceable contact cantilevers 209*c*, 209*d* and contact pads 208 that move with the nano/micro contact bar 72. In general, conductive cantilevers interact with conductive pads and have a variety of nano/micro switch contacts 96 switchably connected therebetween. Each displaceable contact cantilever 209 or displaceable contact pad 208 can be displaced along with the nano/micro contact bar 72 because it is attached thereto such as being fabricated thereto using semiconductor processing techniques. Each fixed substrate-anchored cantilever 210 or substrate anchored pad 218 extends in contact with certain embodiments of the anchored contact segment 74. As such, displacement of the at least one nano/micro actuator 70 respectively upwardly or downwardly (during actuation or deactuation) can move each displaceable switch component either into contact or out of contact with its mating fixed switch contact. Any substrate-anchored cantilevers 210 or substrate anchored pads 218 that is affixed to the anchored contact segments 74 can, for all practical purposes, be considered as being fixedly attached to the substrate 120.

FIG. 4 illustrates a partial cross-sectional view of one embodiment of a nano/micro electro-mechanical relay 60 as taken through sectional lines 4-4 of FIG. 3. Also shown is a dotted outline is a supporting substrate structure. Certain components could function as an embodiment of the NO nano/micro relay switch 80. The FIG. 4 shows one embodiment of the NO nano/micro relay switch 80 includes two NO substrate-anchored cantilevers 210*a,b*, which are respectively attached to a first terminal of each respective pair of distinct NO conductive traces 84*a,b*. When actuated, opposite ends of the NO contact pad 208 are in electrical contact with the two NO substrate-anchored cantilevers 210*a,b*. To establish electrical communication between the NO contact pad 208 and the NO conductive traces 84*a,b*; FIG. 4 illustrates the nano/micro switch contacts 96*a,b* that includes conductive dimples 97*a,b* that are respectively electrically coupled to the NO substrate-anchored cantilevers 210*a,b*. The nano/micro switch contacts 96*a,b* also includes conductive counter dimples 98*a,b* that are respectively electrically coupled to opposite terminals of the NO contact pad 208.

During operation, the NO contact pad 208 (and also the conductive counter dimples 98*a,b* attached thereto) is deflected between normal and actuated positions in a direction shown by arrow 118 by the nano/micro contact bar 72. A closed circuit defining the NO nano/micro relay switch 80 is formed as the conductive counter dimple 98*a* comes in close electrical proximity with, or contacts, the conductive dimple 97*a*; and the conductive counter dimple 98*b* also comes in close proximity (or contact) with the conductive dimple 97*b*. Upon this electrical contact or proximity of the nano/micro switch contacts 96*a* and 96*b*, a closed circuit defines the NO nano/micro relay switch 80 around a loop including the NO conductive trace 84*a*, the NO substrate-anchored cantilever 210*a*, the conductive dimple 97*a*, the conductive counter dimple 98*a*, the NO contact pad 208, the conductive counter dimple 98*b*, the conductive dimple 97*b*, the NO substrate-anchored cantilever 210*b*, and the NO conductive trace 84*b*.

FIG. 5 illustrates a partial cross-sectional view of one embodiment of the nano/micro electro-mechanical relay 60 as taken through sectional lines 5-5 of FIG. 3. Certain components that could function as an embodiment of the NC nano/micro relay switch 82 are illustrated. The FIG. 5 embodiment of the NC nano/micro relay switch 82 includes a pair of respective NC contact cantilevers 209*c,d* that can be controllably electrically switched into electrical communication with each respective NC conductive traces 84*c,d*. The NC contact cantilevers 209*c,d* rest directly on, and are mounted to, the nano/micro contact bar 72, and are electrically isolated thereby. To provide the controllable electrical contacts between each of the NC contact cantilevers 209*c* and 209*d* and the respective NC conductive traces NC conductive trace 84*c* and *d*, FIG. 5 illustrates the nano/micro switch contacts 96*c,d* that includes a pair of conductive dimples 97*c,d* and a pair of conductive counter dimples 98*c,d*. Each of the conductive dimples 97*c,d* is in direct electrical communication and physical contact (by being mounted to) respective NC contact cantilevers 209*c,d*. The two NC contact cantilevers 209*c,d* are physically and electrically conductive with each other, and as such electric current is free to flow therebetween. Each of conductive counter dimples 98*c,d*, is in direct electrical communication and physical contact (by being mounted to) respective NC conductive trace 84*c* and 84*d*. During operation, the NC contact cantilevers 209*c* and 209*d* are displaced between normal and actuated positions as shown by arrow 118. As the conductive counter dimple 98*c* is removed from close electrical proximity (or contact) with the conductive dimple 97*c*, then the conductive counter dimple 98*d* also is removed from close proximity (or contact) with the conductive dimple 97*d*. Upon this electrical contact or proximity, a closed circuit is defined by NC conductive trace 84*c*, conductive counter dimple 98*c*, conductive dimple 97*c*, NC contact cantilever 209*c*, NC contact cantilever 209*d*, conductive dimple 97*d*, conductive counter dimple 98*d*, and NC conductive trace 84*d*.

The field of electrical contacts is generally well understood by those skilled in the art. As such, FIGS. 4 and 5, and the associated disclosure, is intended to show generalized components describing nano/micro switch contact 96 including conductive dimple 97 and conductive counter dimple 98.

Considering the embodiments of the nano/micro electro-mechanical relay 60 including the nano/micro relay switch pair 64 as described with respect to FIGS. 3 to 5, consider that for each NO nano/micro relay switch 80 and NC nano/micro relay switch 82, there is a respective pair of NO conductive traces 84*a,b* or NC conductive traces 84*c,d* in electrical communication therewith. The pair of conductive traces 84 may be considered as conductors to more macro-electronics such as electrical connections. Each conductive trace 84*a* to 84*d* has to pass across the junction between the nano/micro contact bar 72 and the anchored contact segment 74, thereby necessitating some type of electrical contact cantilever, some type of electrical contact pad, and some type of nano/micro switch contact 96 operating as a switch between the cantilever and the pad based on motion of the cantilever or the pad. As such, each NO nano/micro relay switch 80 and NC nano/micro relay switch 82 connects to two conductive traces 84, and therefore is actually made up of two identical nano/micro switch contacts 96, not one. One switch contact is necessary for each conductive trace 84 that passes across the junction between the nano/micro contact bar 72 to the anchored contact segments 74. Each of these nano/micro switch contacts 96 function similar to the other as the nano/micro relay switch pair 64 becomes actuated or deactuated, and moves up and down simultaneously with the nano/micro actuator bar 72.

NO nano/micro relay switches 80 can be simultaneously actuated with the NC nano/micro relay switches 82. Such simultaneous actuation and deactuation of multiple nano/micro relay switches (or even arrays thereof), between their normal states and actuated states, would be highly desired for digital logic circuits that often rely upon having a variety of logic gates operate simultaneously for each device, where many of the devices act in concert is well known throughout the computer, controller, automation, robotics, and other such digital applications. This disclosure thereby can be used to provide a variety of digital relay circuits 79, comprising pairs of NO nano/micro relay switches 80 and NC nano/micro relay switch 82. Integral digital relay circuits 79 can contribute to form a variety of digital devices such as adders, memory elements, microcontrollers, and even combinations of such devices as described in this disclosure.

Certain embodiments of the nano/micro electro-mechanical relay 60 can be used to perform digital operations. A true Boolean value can be defined by the output voltage being greater than an average voltage value. A false Boolean value can be defined by the output voltage being less than the average voltage value. Certain embodiments of the nano/micro electro-mechanical relay 60 can function as a six terminal device that can provide digital logic. Two NC conductive traces 84*c*, 84*d* can be referred to as normally closed outputs. Two NO conductive traces 84*a*, 84*b* can be referred to as the normally open outputs. Based on wiring, certain embodiments of the nano/micro electro-mechanical relay 60 can perform all 16 uniquely differentiable 2-input Boolean functions.

An electrical voltage bias can be applied to certain embodiments of the nano/micro electro-mechanical relay 60 to reduce the overall swing voltage necessary to change between normal and actuated states. Such electrical voltage bias causes a reduction in dynamic power necessary to change the states between normal and actuated. The total power is reduced by using the nano/micro electro-mechanical relay 60 configuration since the leakage current (which can be equated to leakage power) of the electrical voltage bias that is applied between the actuator electrode layers 204 and 206 through the piezoelectric actuator layer 205 is very low. Applying such electrical voltage bias reduces switching time, since less charge is necessary to transition the nano/micro actuator 70 from one state to another, and also because the gap is reduced between conductive dimple 97 and conductive counter dimple 98. From this, the general electro-mechanical operation of certain embodiments of the nano/micro switch pair 64 can be very good whether being used digitally such as in arrays, or being used as discrete devices.

Certain embodiments of the nano/micro electro-mechanical relay 60 can be used as a low-leakage technique for clock-gating either a pure mechanical, or a hybrid mechanical-electronics system to reduce the overall power consumption and provide capacitance. Certain embodiments of the nano/micro electro-mechanical relay 60 can also be used as a low-leakage method for removing parts of a system from a power grid, or other electrical circuits. As such, the nano/micro electro-mechanical relay 60 can provide electrical isolation.

Figure 6:
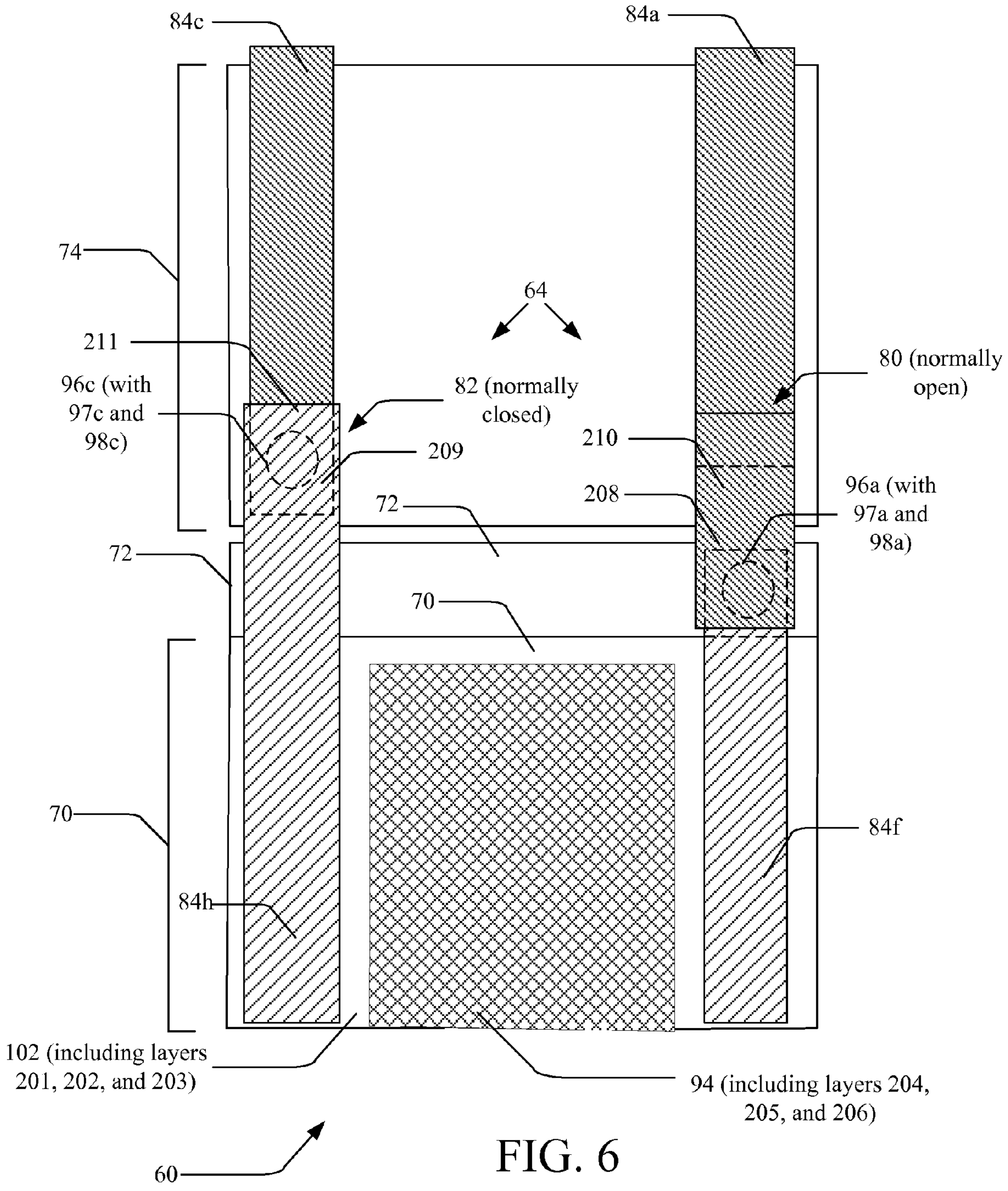
FIG. 6 is a top view of another embodiment of the nano/micro electro-mechanical relay, which is configured to include the nano/micro relay switch pair.

FIG. 6 is a top view of another embodiment of a nano/micro electro-mechanical relay 60, which is configured to include the nano/micro relay switch pair 64. The NO nano/micro relay switch 80 is in electrical communication with the NO conductive trace 84*a* that extends over and is affixed to the anchored contact segment 74, and the NO conductive trace 84*f* that extends over and is affixed to the nano/micro actuator 70. The NO conductive trace 84*a* is in electrical communication with the NO substrate-anchored cantilever 210, while the NO conductive trace 84*f* is in electrical communication with the NO contact pad 208. The nano/micro switch contact 96*a* includes relatively displaceable conductive dimple 97*a* attached to the NO substrate-anchored cantilever 210 and also the conductive counter dimple 98*a* electrically connected to the NO contact pad 208 and the NO conductive trace 84*f*. The nano/micro switch contact 96*a* therefore provides for the electrical connection between the NO substrate-anchored cantilever 210 and the NO contact pad 208 as a result of the vertical motion of the nano/micro contact bar 72 (the motion provided by the nano/micro actuator 70) between its actuated and normal positions. As such, an electrical path associated with the NO nano/micro relay switch 80 extends from the NO conductive trace 84*a*, the NO substrate-anchored cantilever 210, the conductive dimple 97*a*, the conductive counter dimple 98*a*, the NO contact pad 208, and the NO conductive trace 84*f*.

Certain embodiments of the NC nano/micro relay switch 82, as described with respect to FIG. 6, is in electrical communication with both the NC conductive trace 84*c* that extends over and is affixed to the anchored contact segment 74, and the NC conductive trace 84*h* that extends over and is affixed to the nano/micro actuator 70. The NC conductive trace 84*c* is in electrical communication with the substrate anchored pad 218, while the NC conductive trace 84*h* is in electrical communication with the NC contact cantilever 209. The nano/micro switch contact 96*c* includes relatively displaceable conductive counter dimple 98*c* attached to the substrate anchored pad 218 and also the conductive dimple 97*c* electrically connected to the NC contact cantilever 209. The nano/micro switch contact 96*c* therefore provides for the electrical connection between the NC contact cantilever 209 and the substrate anchored pad 218 based on the vertical motion of the nano/micro contact bar 72 (the motion provided by the nano/micro actuator 70) between its actuated and normal positions. As such, an electrical path associated with the NC nano/micro relay switch 82 extends from the NC conductive trace 84*c*, the conductive counter dimple 98*c*, the conductive dimple 97*c*, the NC contact cantilever 209, and the NC conductive trace 84*h*.

A certain percentage of relatively high-frequency electrical signals applied to either conductive trace associated with NO or NC nano/micro relay switches 80, 82, when open, flows to the corresponding conductive trace due to electrical capacitance formed across capacitive plates (formed by the conductive dimple 97 and the conductive counter dimple 98) of the included nano/micro switch contact 96. By comparison, lower frequency signals are nearly entirely attenuated by the capacitance of the capacitive plates formed by the nano/micro switch contact 96 associated with NO or NC nano/micro relay switches 80, 82 (when open). As such, spacing between the conductive dimple 97 and the conductive counter dimple 98 can be selected, designed, or adjusted to vary the frequencies of signals transmitted or attenuated through each nano/micro switch contact 96 (when in the open position). The above describes one embodiment of capacitive coupling as provided by the conductive dimple 97 and the conductive counter dimple 98. By comparison, a capacitive coupling can also exist, as well as be designed for, between or within the conductive trace lines 84*a* to 84*d*, 84*f*, and 84*h* for similar purposed, for example.

Both the NO set including the NO substrate-anchored cantilever 210 and NO conductive traces 84*c*, *f*; as well as the normally closed set including NC contact cantilever 209 and its NC conductive traces 84*c* and 84*h*, may be viewed as forming a single contact point where the voltages are at a single level when the respective NO nano/micro relay switches 80 are actuated or closed.

The location, configuration, and dimensions of the piezoelectric stack layers 94 define the operational characteristics of the nano/micro actuator 70. Those embodiments of the nano/micro actuator 70 that have the piezoelectric stack layers 94 deposited thereupon contributes to the bending of the nano/micro actuator 70. As such, different nano/micro electro-mechanical relay 60 may be configured differently during fabrication by having different length, width, depth, or other configuration of the nano/micro actuators 70. Those nano/micro electro-mechanical relays 60 with longer nano/micro actuators 70 would require a lesser voltage to transition between normal and actuated states. The voltage level at which the voltage that each active nano/micro relay switch 80, 82 transitions between normal and active states could be designed, calibrated, or confirmed.

A variety of NO nano/micro relay switches 80 can be configured as an analog to digital (ND) converter in which the calibrated transition value for each device could be determined. Different ones of the NO nano/micro relay switches 80 have nano/micro actuators 70 that have different lengths or other dimensions, and each NO nano/micro relay switch 80 deflects a different distance based on their length at a given bias voltage with those NO nano/micro relay switches 80 having a longer nano/micro actuator 70 deflecting further at the same bias voltage. The maximum deflection can be set for each NO nano/micro relay switches 80, in certain embodiments. The established ranges set up between the calibrated values for successive NO nano/micro relay switches 80. As such, during operation, all those different NO nano/micro relay switches 80 whose calibrated voltage value is below that of the applied voltage would be actuated, and those different nano/micro relay switches 80, 82 whose calibrated voltage value is above that of the applied voltage would not be actuated. For instance, assuming that there are eight NO nano/micro relay switches 80 for a particular ND converter, between 0 and 8 NO nano/micro relay switches 80 is closed at any given voltage. A digital output value of "11100000" would indicate that the actual analog value is between the calibrated value of the third NO nano/micro relay switch 80 and the fourth. The range above the nano/micro relay switches 80, 82 with the highest calibrated voltage value would indicate the range of the actual applied voltage in a digital manner.

Figure 7:
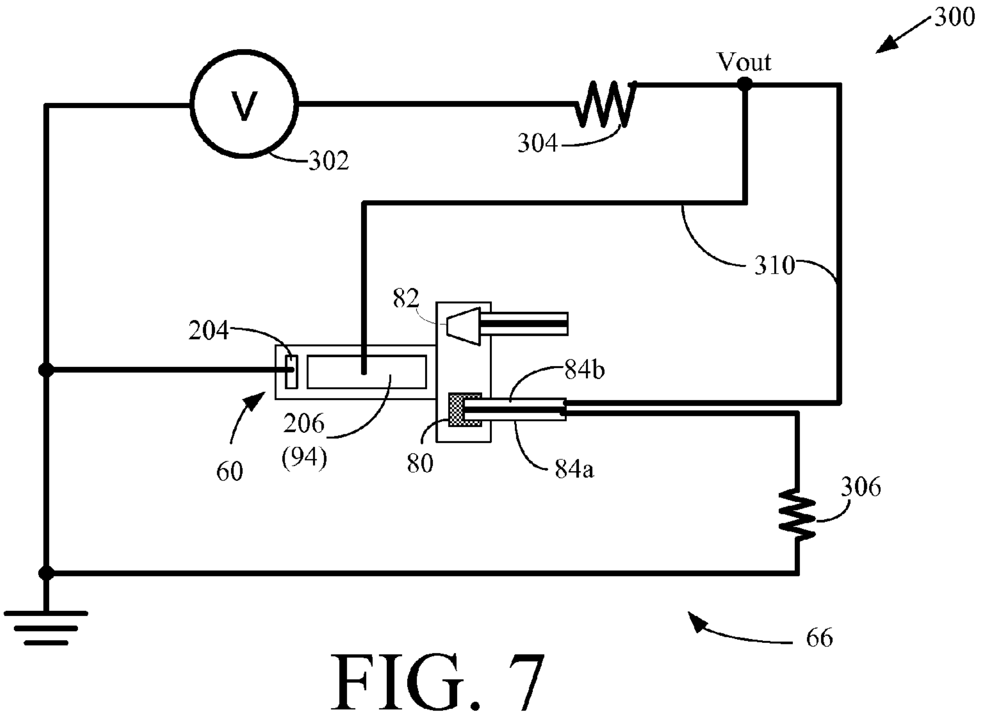
FIG. 7 shows a schematic diagram of one embodiment of a relaxation oscillator that can be fabricated using the nano/micro electro-mechanical relay.

There are a number of nano/micro electro-mechanical digital relay circuits 66 that can be configured with one or more nano/micro electro-mechanical relays 60. FIG. 7 shows a schematic diagram of one embodiment of a relaxation oscillator 300 that can be fabricated using the nano/micro electro-mechanical relay 60. For example, FIG. 7 shows a schematic diagram of one embodiment of a relaxation oscillator 300 that can be fabricated comprising the NO nano/micro relay switch 80 of the nano/micro electro-mechanical relay 60 (the NC nano/micro relay switch 82 is not involved in this relaxation oscillator configuration), a voltage source 302, and external resistors 304 and 306. The electrical resistance of resistor 306 is considerably less than that of resistor 304. As per FIG. 7, a feedback loop 310, set at the output voltage for the relaxation oscillator, forms by electrically coupling NO conductive trace 84*b* to one terminal of the resistor 304 and also the actuator electrode layer 206 of the piezoelectric stack layers 94. The actuator electrode layer 206 of the piezoelectric stack layers 94 is electrically grounded. The voltage source provides voltage to the other terminal of the external resistor 304. The NO conductive trace 84*b* is electrically grounded via resistor 306.

During operation, the voltage supplied by voltage source 302 incrementally increases Vout, which is also applied at the electric contact of the actuator electrode layer 206. The actuator electrode layer 204 is grounded. Vout builds to a level actuating the nano/micro actuator 70, which actuates the NO nano/micro relay switch 80 causing the latter to close. Once the NO nano/micro relay switch 80 closes, the voltage at Vout discharges through the low resistance resistor 306 providing a low resistance pathway to ground and quickly returning the NO nano/micro relay switch 80 to its normal, open condition. The operation process of this paragraph repeats itself to produce the oscillation.

Figure 8:
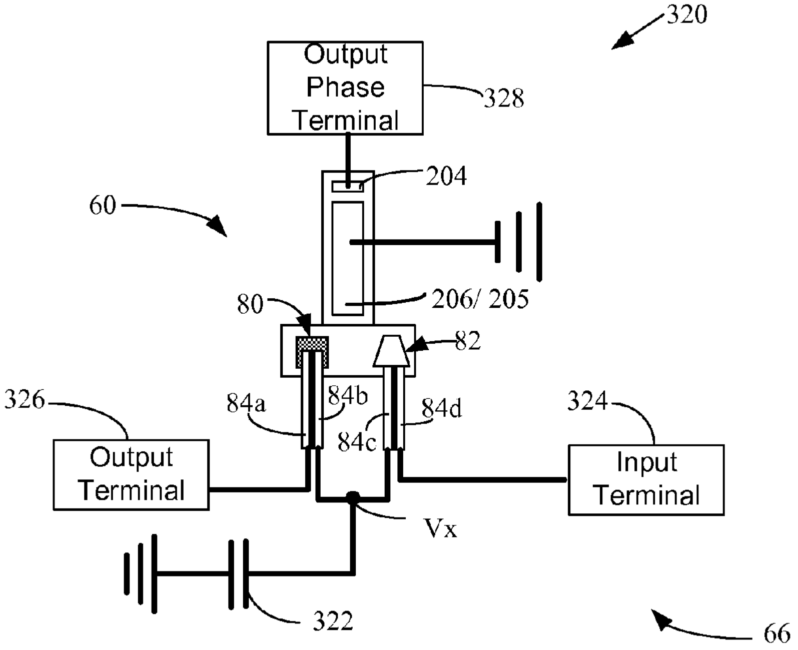
FIG. 8 shows a schematic diagram of one embodiment of a dynamic latch that can be fabricated using one nano/micro electro-mechanical relay and a capacitive element.

FIG. 8 shows a schematic diagram of one embodiment of a dynamic latch 320 that can be fabricated using one nano/micro electro-mechanical relay 60 and a capacitive element 322. Certain embodiments of the capacitive element 322 can be configured as portion of another NO nano/micro relay switch 80 (using the conductive dimple and conductive counter-dimples to form two spaced capacitive plates when open), or alternately a distinct capacitor. An input is applied to input terminal 324, which is in electrical communication with NC conductive trace 84*d*. An electric voltage source $V_0$ is electrically applied between NO conductive trace 84*b* and NC conductive trace 84*c*, and also one terminal of capacitive element 322. An output terminal 326 is in electrical communication with the NO conductive trace 84*a*. The actuator electrode layer 206 can be grounded, but in an alternate configuration, not shown, it can be tied to an arbitrary potential (such as the high voltage rail) to alter the sequential throughput of the element in that circuit. If the actuator electrode layer 206 is attached to the high voltage rail, then the clock signal at the phase output ϕ becomes inverted, so the states for the clock signal would be reversed. The phase ϕ is output from the phase output terminal 328 to the actuator electrode layer 204.

During operation of the dynamic latch 320, the normal state of the nano/micro electro-mechanical relay 60 allows the input terminal 324 to charge or discharge the capacitive element 322 while isolating the output terminal 326. By comparison, when activated, the nano/micro electro-mechanical relay 60 isolates the input terminal 324 from charging or discharging the capacitive element 322, and the output terminal 326 electrically couples to charge or discharge the capacitive element 322. In this configuration, the nano/micro electro-mechanical relay 60 acts both as data storage and retrieval. This device utilizes only one nano/micro electro-mechanical relay 60, which compares to in CMOS design where at least 2 MOSFETS (and typically 4 to limit signal degradation) would be used. The dynamic latch 320 configured with the capacitive element 322 would be expected to maintain its charged state (or uncharged state) for a considerable time such as to allow a temporary interruption in power.

Figure 9:
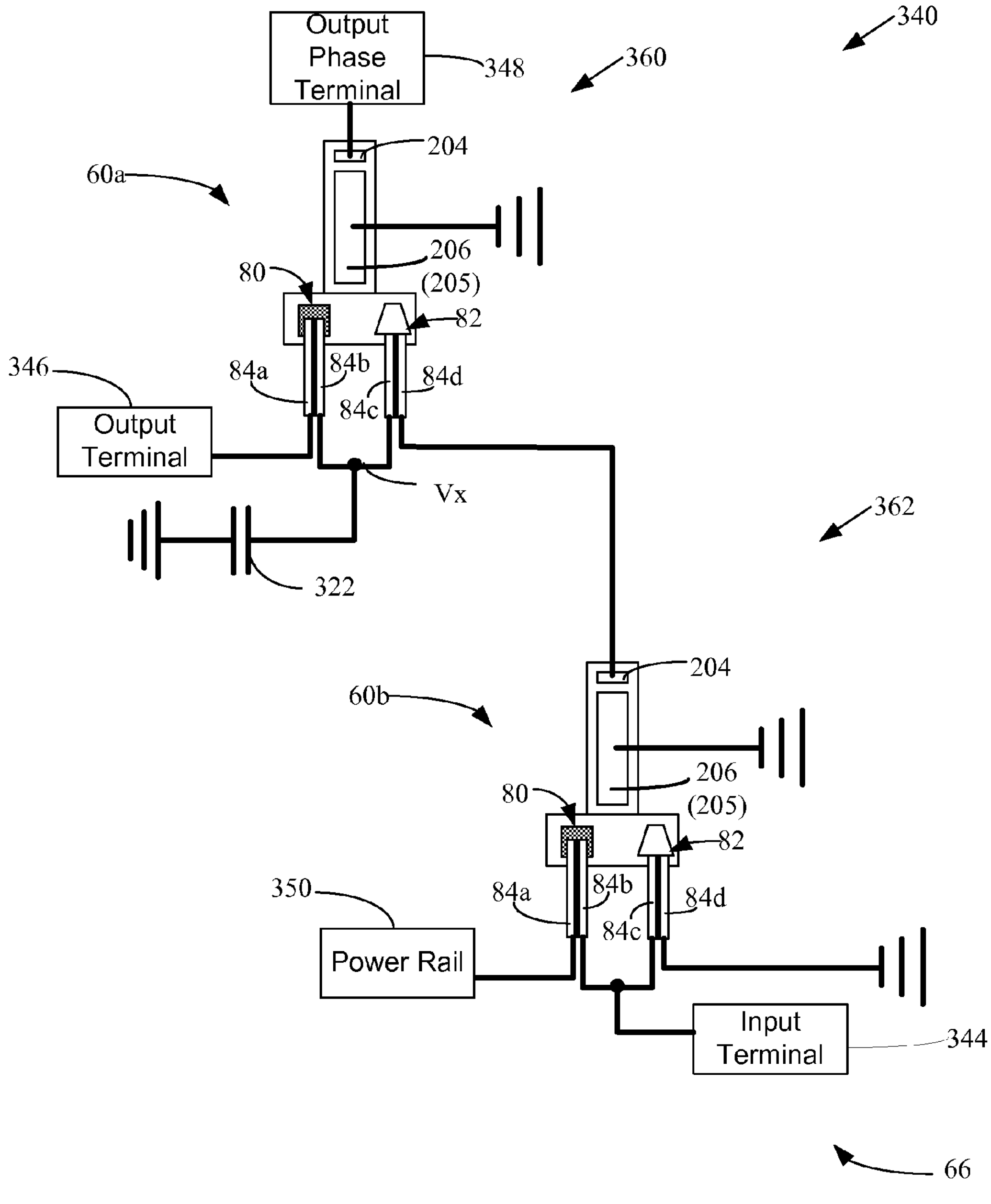
FIG. 9 shows a schematic diagram of one embodiment of a dynamic latch with a buffer that can be fabricated using one dynamic latch, as described with respect to FIG. 8.

FIG. 9 shows a schematic diagram of one embodiment of a dynamic latch with buffer 340 that can be fabricated by combining a nano/micro electro-mechanical relay 60*a* configured as a dynamic latch 360 (similar in structure and operation as the dynamic latch 320 described in FIG. 8), a nano/micro electro-mechanical relay 60*b* configured as a buffer 362, a least one capacitive element 322, and associated circuitry. The dynamic latch 360 comprises the nano/micro electro-mechanical relay 60*a*, while the buffer 362 comprises the nano/micro electro-mechanical relay 60*b*. Each nano/micro electro-mechanical relay 60*a* and 60*b* is as described above and the reference characters are consistent except where now noted. The NO conductive trace 84*b* and NC conductive trace 84*c* of the buffer 362 is in electrical communication with an input terminal 344. A power rail 350 is in electric communication with NO conductive trace 84*a* of buffer 362. NC conductive trace 84*d* and actuator electrode layer 206 of buffer 362 are both grounded.

An output terminal 346 is in electrical communication with NO conductive trace 84*a* of the dynamic latch 360. The NC conductive trace 84*d* of dynamic latch 360 electrically communicates to the actuator electrode layer 204 of the buffer dynamic latch 360. The output phase terminal 348 electrically couples to actuator electrode layer 204 of the dynamic latch 360. The buffer 360 acts to drive higher capacitance loads within the capacitive element 322, and would allow the data to be maintained for an extended period (e.g., perhaps hours) that is related to leakage through piezoelectric actuator layer 205 of the dynamic latch 360. The buffer 362 also allows new data to be written into and maintained for a considerable duration by the capacitive element 322 of the dynamic latch 360, while the previous piece of data is being used elsewhere in the nano/micro electro-mechanical digital relay circuit 66. As such, the dynamic latch with buffer 340 includes two nano/micro relay switch pairs 64, instead of certain current CMOS designs that use at least 4 MOSFETS, and typically 6 to limit signal degradation.

Additionally, though not shown, two dynamic latches with buffer 340, of the type described with respect to FIG. 9, could be further combined to provide a dynamic flip-flop with edge sensitivity to the storage process for mechanical logic. To make such a modification to the two dynamic latches 340 of FIG. 9, the input terminal 344 of a first dynamic latch 340 is electrically coupled only to the NO conductive trace 84*a* of the second dynamic latch 340. During operation, the values stored in one dynamic latch 340 are sequentially passed to the other dynamic latch during each clock cycle. The dynamic flip-flop can be fabricated using four nano/micro relay switch pairs 64*a* and 64*b* (two of each for both flip flop) while still providing excellent operation instead of often more switch-type devices with CMOS designs. As such, a variety of sophisticated yet durable devices can be fabricated using arrays of nano/micro relay switch pairs 64, and such devices may be fabricated using relatively few devices and chip real estate while limiting current loss during operation. Additionally, arrays of nano/micro relay switch pairs 64 can be inexpensively fabricated yet made with robust operating parameters, even to allow devices to be crafted to be radiation hardened, and exposed to severe climate conditions, etc. for varied military or civilian applications. Certain devices could be expected for aviation, space, nuclear containment, internal engine, or other such harsh environments; as with many discrete electromechanical relays. Such devices can be used in combination with, or in place of, many CMOS or other transistor-based devices for such computer or communication device applications as with processors, memories, logic gates, switching matrices, power gating, etc.

Various elements, devices, modules and circuits are described above in associated with their respective functions. These elements, devices, modules and circuits are considered means for performing their respective functions as described herein.

While the foregoing is directed to embodiments of the present invention, other and further embodiments of the invention may be devised without departing from the basic scope thereof, and the scope thereof is determined by the claims that follow.

The invention claimed is:

1. A nano/micro electro-mechanical relay, comprising:

at least one normally open (NO) nano/micro relay switch and at least one normally closed (NC) nano/micro relay switch, both of which operationally include at least one displaceable contact pad that can be displaced relative to at least one substrate anchored pad to substantially simultaneously switch the NC nano/micro relay switch and the NO nano/micro relay switch between their respective normal relay switch positions and their respective actuated relay switch positions;

an at least one nano/micro actuator including at least one piezoelectric stack layer being attached to at least one elastic layer, wherein to actuate the at least one nano/micro actuator, the at least one piezoelectric stack layer contracts to deflect the at least one elastic layer; and at least one nano/micro contact bar that when actuated by the at least one nano/micro actuator configured to simultaneously switch the NC nano/micro relay switch and the NO nano/micro relay switch between their respective normal relay switch position and their respective actuated relay switch positions at least partially in response to deflection of the at least one nano/micro actuator.

2. The nano/micro electro-mechanical relay of claim 1, wherein the at least one displaceable contact pad comprises at least one displaceable contact cantilever.

3. The nano/micro electro-mechanical relay of claim 1, wherein the at least one substrate anchored pad comprises an at least one substrate anchored cantilever.

4. The nano/micro electro-mechanical relay of claim 1, further comprising at least one etch hole formed in a piezoelectric actuating layer.

5. The nano/micro electro-mechanical relay of claim 1, further comprising at least one etch hole formed in a piezoelectric actuating layer, and wherein multiple nano/micro actuators are at least partially defined and separated by said etch hole.

6. The nano/micro electro-mechanical relay of claim 1, wherein the at least one NO nano/micro relay switch comprises a single switch contact.

7. The nano/micro electro-mechanical relay of claim 1, wherein the at least one NO nano/micro relay switch comprises at least two switch contacts.

8. The nano/micro electro-mechanical relay of claim 1, wherein the at least one NC nano/micro relay switch comprises a single switch contact.

9. The nano/micro electro-mechanical relay of claim 1, wherein the at least one NC relay switch comprises at least two switch contacts.

10. The nano/micro electro-mechanical relay of claim 1, wherein the at least one elastic layer is formed at least partially from at least one dielectric material.

11. The nano/micro electro-mechanical relay of claim 1, wherein the at least one piezoelectric stack layer comprises a bottom actuator electrode layer, a piezoelectric actuator layer, and a top actuator electrode layer.

12. The nano/micro electro-mechanical relay of claim 11, wherein biasing the top actuator electrode layer relative to the bottom actuator electrode layer transitions the at least one normally open relay switch and at least one normally closed relay switch between their normal switch positions and actuated switch positions.

13. The nano/micro electro-mechanical relay of claim 1, wherein the at least one NO relay switch and at least one NC relay switch further comprises at least one array of NO relay switches and at least one array of NC relay switches.

14. The nano/micro electro-mechanical relay of claim 1, that is at least partially integrated within an at least one nano/micro electro-mechanical digital relay circuit.

15. The nano/micro electro-mechanical relay of claim 14, wherein the at least one nano/micro electro-mechanical digital relay circuit comprises at least one nano/micro relay switch pair.

16. The nano/micro electro-mechanical relay of claim 15, wherein the at least one nano/micro relay switch pair is configured to operate as an oscillator.

17. The nano/micro electro-mechanical relay of claim 15, wherein the at least one nano/micro relay switch pair is configured to operate as a latch.

18. The nano/micro electro-mechanical relay of claim 15, wherein the at least one nano/micro relay switch pair includes a plurality of nano/micro relay switch pairs, different ones of the nano/micro relay switch pairs are each configured with nano/micro actuators having different dimensions, and based on the different dimensions of the actuator, the voltages necessary to transition the nano/micro relay switch pairs differ.

19. A method, comprising:

providing at least one nano/micro relay switch pair including at least one normally open (NO) nano/micro relay switch and at least one normally closed (NC) nano/micro relay switch;

simultaneously switching the at least one nano/micro relay switch pair between their respective normal relay switch positions and their respective actuated relay switch positions, wherein the simultaneously switching is performed by an at least one nano/micro actuator including at least one piezoelectric stack layer contracting to deflect an at least one elastic layer.

20. The method of claim 19, further comprising actuating at least one nano/micro contact bar to simultaneously switch the NC nano/micro relay switch and the NO nano/micro relay switch between their respective normal relay switch position and their respective actuated relay switch positions.

* * * * *